United States Patent
Lee et al.

(10) Patent No.: US 8,052,889 B2
(45) Date of Patent: Nov. 8, 2011

(54) ETCHANT COMPOSITION, AND METHODS OF PATTERNING CONDUCTIVE LAYER AND MANUFACTURING FLAT PANEL DISPLAY DEVICE USING THE SAME

(75) Inventors: Kyoung Mook Lee, Seoul (KR); Kye Chan Song, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 64 days.

(21) Appl. No.: 12/461,202

(22) Filed: Aug. 4, 2009

(65) Prior Publication Data

US 2010/0032613 A1 Feb. 11, 2010

Related U.S. Application Data

(62) Division of application No. 11/453,079, filed on Jun. 15, 2006, now Pat. No. 7,582,217.

(30) Foreign Application Priority Data

Aug. 8, 2005 (KR) ........................ 10-2005-0072338

(51) Int. Cl.
   *C09K 13/00* (2006.01)
(52) U.S. Cl. ...................... 252/79.1; 252/79.2; 252/79.4
(58) Field of Classification Search .................. None
   See application file for complete search history.

(56) References Cited

U.S. PATENT DOCUMENTS

| 7,371,622 | B2 | 5/2008 | Park et al. | |
|---|---|---|---|---|
| 7,566,404 | B2 * | 7/2009 | Liu et al. | 216/13 |
| 2002/0192883 | A1 | 12/2002 | Lee et al. | |
| 2004/0140288 | A1 * | 7/2004 | Patel et al. | 216/2 |
| 2004/0242017 | A1 | 12/2004 | Park et al. | |
| 2005/0072754 | A1 | 4/2005 | Shih et al. | |
| 2005/0263490 | A1 * | 12/2005 | Liu et al. | 216/84 |
| 2006/0131586 | A1 | 6/2006 | Kim et al. | |
| 2006/0249482 | A1 * | 11/2006 | Wrschka et al. | 216/88 |
| 2006/0289383 | A1 | 12/2006 | Song et al. | |
| 2007/0108442 | A1 | 5/2007 | Song et al. | |
| 2008/0012011 | A1 | 1/2008 | Song et al. | |
| 2008/0035917 | A1 | 2/2008 | Choi et al. | |
| 2008/0062348 | A1 | 3/2008 | Sasuga et al. | |

FOREIGN PATENT DOCUMENTS

| JP | 2005 163070 A | 6/2005 |
|---|---|---|
| KR | 10-2003-0041694 A | 5/2003 |
| KR | 10-2004-0029289 A | 4/2004 |

\* cited by examiner

*Primary Examiner* — Anita Alanko (74) *Attorney, Agent, or Firm* — McKenna Long & Aldridge LLP (57) ABSTRACT

An etchant composition, and methods of patterning a conductive layer and manufacturing a flat panel display device using the same are provided. The etchant composition may include phosphoric acid, nitric acid, acetic acid, water and an additive, wherein the additive includes a chlorine-based compound, a nitrate-based compound, and an oxidation regulator. In addition, the flat panel display device may be manufactured by patterning a gate electrode, source/drain electrodes and a pixel electrode using the same etchant composition. The gate electrode, source/drain electrodes and the pixel electrode may be formed of different conductive materials. Accordingly, processes are simplified so that manufacturing costs may be reduced and productivity may be improved.

5 Claims, 12 Drawing Sheets

ETCHANT COMPOSITION, AND METHODS OF PATTERNING CONDUCTIVE LAYER AND MANUFACTURING FLAT PANEL DISPLAY DEVICE USING THE SAME

This application is a divisional of application Ser. No. 11/453,079, filed Jun. 15, 2006 now U.S. Pat. No. 7,582,217, which claims priority to Korean Patent Application Nos. 10-2005-0072338, filed on Aug. 8, 2005, both of which are hereby incorporated by reference for all purposes as if fully set forth herein.

BACKGROUND OF THE INVENTION

1. Field of the Invention

The present invention relates to an etchant composition, and methods of patterning a conductive layer and manufacturing a flat panel display device using the same. More particularly, the present invention relates to an etchant composition capable of simultaneously etching aluminum, molybdenum and indium-tin-oxide, and methods of patterning a conductive layer and manufacturing a flat panel display device using the same.

2. Description of the Related Art

Flat panel display devices are generally classified into passive matrix type flat panel display devices and active matrix type flat panel display devices, according to the driving scheme employed in the flat panel display device. An active matrix type flat panel display device incorporates circuitry employing a thin film transistor (TFT). This circuitry is generally used for flat panel display devices such as a liquid crystal display (LCD) devices, organic electroluminescence display devices (OLED), etc. Active matrix type flat panel display devices are advantageous in that they have high resolution and an excellent capability of displaying a moving picture. It is also possible to enlarge the size of the display panel.

In the active matrix type flat panel display device, a TFT having a gate electrode and source/drain electrodes is formed. Also, a plurality of interconnections and a pixel electrode may be formed by patterning respective conductive layers of different conductive materials. For instance, the gate electrode is formed of a predetermined conductive material with low resistivity such as aluminum (Al), molybdenum (Mo) and copper (Cu), or an alloy thereof. In addition, the source/drain electrode may be formed of a conductive material such as Mo, chromium (Cr) and Al, or an alloy thereof. The pixel electrode may be formed as a transparent electrode of indium-tin-oxide (ITO) or indium-zinc oxide (IZO). Furthermore, although any one of the conductive layers may be formed as a single layer, it may alternatively be formed as a multilayer formed of different materials in order to obtain beneficial properties.

However, it is difficult to etch respective conductive layers formed of different materials with the same etchant composition because each of the conductive layers has an etching rate different from each other. In addition, because different etchants for different compositions are used, an etching apparatus for one conductive layer is different from an etching apparatus for another conductive layer. Thus, the etching process for forming the TFT and the plurality of interconnections is complicated, and manufacturing costs and manufacturing time increase. This results in a decreased productivity.

To overcome this problem, many efforts have been made to develop an etchant capable of simultaneously etching conductive layers formed of different materials.

For example, an etchant composition capable of simultaneously etching aluminum (Al) and ITO has been developed. As a result, the etching process is performed simultaneously on the gate electrode and the pixel electrode using the same etchant so that productivity is improved. In addition, an etchant composition capable of simultaneously etching a Mo/AlNd bilayer and a single layer of Mo has been suggested. Therefore, conductive layers of different materials may be etched using the same etchant to form the gate electrode and the source/drain electrodes.

However, an etchant which may simultaneously etch Al, Mo and ITO has not been developed. Therefore, it is impossible to form the TFT and the pixel electrode using the same etchant composition.

SUMMARY OF THE INVENTION

Accordingly, the present invention is directed to an etchant composition, and methods of patterning a conductive layer and manufacturing a flat panel display device using the same that substantially obviate one or more problems due to limitations and disadvantages of the related art.

An advantage of the present invention is to provide an etchant composition capable of simplifying an etching process and minimizing manufacturing costs, and methods of patterning a conductive layer and manufacturing a flat panel display device using the same.

Additional features and advantages of the invention will be set forth in the description which follows, and in part will be apparent from the description, or may be learned by practice of the invention. These and other advantages of the invention will be realized and attained by the composition and methods particularly pointed out in the written description and claims hereof as well as the appended drawings.

To achieve these and other advantages and in accordance with the purpose of the present invention, as embodied and broadly described, an etchant composition includes a phosphoric acid, a nitric acid, an acetic acid, water and an additive, wherein the additive includes a chlorine-based compound, a nitrate-based compound, a sulfate-based compound, and an oxidation regulator.

In another aspect of the present invention, a method of patterning a conductive layer includes: providing a substrate; forming a conductive layer on the substrate, wherein the conductive layer is a single layer formed of at least one of Al, AlNd alloy, Mo, and ITO, or a multilayer thereof; forming a photoresist layer on the conductive layer; pattering the photoresist layer by photoexposure; and etching the conductive layer using the patterned photoresist layer as an etch mask, wherein an etchant composition used to etch the conductive layer includes a phosphoric acid, a nitric acid, an acetic acid, a chlorine-based compound, a nitrate-based compound, a sulfate-based compound, an oxidation regulator, and water.

In another aspect of the present invention, a method of manufacturing a flat panel display device includes: providing a substrate; forming a first conductive layer on the substrate; patterning the first conductive layer to form a gate electrode; forming a gate insulating layer on the gate electrode; forming a semiconductor layer on the gate insulating layer corresponding to the gate electrode; forming a second conductive layer on the semiconductor layer; patterning the second conductive layer to form source/drain electrodes; forming a passivation layer over an entire surface of the substrate including the source/drain electrodes, wherein the passivation layer has a contact hole exposing a portion of the drain electrode; forming a third conductive layer on the passivation layer to be electrically connected to the drain electrode through the contact hole; and patterning the third conductive layer to form a pixel electrode, wherein the gate electrode, the source/drain electrodes and the pixel electrode are patterned using one etchant composition.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiment(s) of the invention and together with the description serve to explain the principles of the invention. In the drawings.

DETAILED DESCRIPTION OF THE ILLUSTRATED EMBODIMENTS

Reference will now be made in detail to exemplary embodiments of the present invention, examples of which are illustrated in the accompanying drawings. Wherever possible, the same reference numbers will be used throughout the drawings to refer to the same or similar parts.

An etchant composition according to an embodiment of the present invention includes a nitric acid, a phosphoric acid, an acetic acid, water and an additive. The etchant composition may be used for etching a conductive layer configured with a single layer formed of at least one of aluminum (Al), aluminum-neodymium (AlNd) alloy, molybdenum (Mo), and indium-tin-oxide (ITO), or a multilayer thereof.

The nitric acid of the etchant composition may react with aluminum (Al) to form aluminum oxide ($Al_2O_3$). The content of the nitric acid may be in a range of about 3 weight % (wt %) to 15 wt % in the etchant composition to effectively control the etching selectivity in etching a Mo/AlNd bilayer. If the Mo/AlNd bilayer is wet-etched using an etchant composition having a nitric acid concentration of less than 3 wt %, an undercut phenomenon may occur.

The phosphoric acid decomposes the aluminum oxide ($Al_2O_3$) generated by the reaction of the nitric acid and the aluminum to thereby increase the etching rate of the conductive layer and enhance productivity. The content of the phosphoric acid may be in a range of 40 wt % to 70 wt % in the etchant composition. If the content of the phosphoric acid exceeds 70 wt %, the viscosity of the etchant may increase to thereby cause over-etching. Over-etching may occur because the removal time of the etchant becomes longer during a rinsing process due to the increased viscosity of the etchant. However, productivity may be improved because of the large quantity of phosphoric acid. Also, if the content of the phosphoric acid is less than 40 wt %, the etching rate of the conductive layer may be reduced so that productivity may be decreased.

The acetic acid acts as a buffer agent for controlling the reaction speed. The content of the acetic acid may be in a range of 5 wt % to 35 wt % in order to appropriately control the etching rate. If the content of the acetic acid is less than 5 wt %, an undercut phenomenon may occur in the Mo/AlNd bilayer.

The etchant composition includes a residual quantity of water. The water plays a role in decomposing the aluminum oxide ($Al_2O_3$) generated by the reaction of the nitric acid and the aluminum. The water also dilutes the etchant composition. Pure water filtered through an ion exchange resin may be used. Preferably, the water may be ultra pure water with a resistivity of 180 MΩ or more.

The additive may include a chlorine-based compound, a nitrate-based compound, a sulfate-based compound and an oxidation regulator.

The chlorine-based compound may be a compound which dissociates into a chlorine ion (Cl—). For instance, the chlorine-based compound may be at least one selected from the group consisting of KCl, HCl, LiCl, NaCl, $NH_4Cl$, $CuCl_2$, $FeCl_3$, $FeCl_2$, $CaCl_2$, $CoCl_2$, $NiCl_2$, $ZnCl_2$, $AlCl_3$, $BaCl_2$, $BeCl_2$, $BiCl_3$, $CdCl_2$, $CeCl_2$, $CsCl_2$, $CrCl_3$ and $H_2PtCl_3$.

The chlorine-based compound plays a role in controlling the etching rate of amorphous ITO, a Mo single layer, and a Mo/AlNd bilayer.

The content of the chlorine-based compound may be in a range of about 0.02 wt % to 5 wt % in order to prevent an undercut phenomenon of the AlNd layer in a Mo/AlNd bilayer. The chlorine-based compound also plays a role in the excellent etching profiles of amorphous ITO and the Mo single layer. If the content of the chlorine-based compound is less than 0.02 wt %, the etching rate of the amorphous ITO may become slow, which results in decreased productivity. However, if the content of the chlorine-based compound is more than 5 wt %, an undercut phenomenon in the Mo/AlNd bilayer may occur.

The nitrate-based compound may be at least one selected from the group consisting of $NH_4NO_3$, $KNO_3$, $LiNO_3$, $Ca(NO_3)_2$, $NaNO_3$, $Zn(NO_3)_2$, $Co(NO_3)_2$, $Ni(NO_3)_2$, $Fe(NO_3)_3$, $Cu(NO_3)_2$ and $Ba(NO_3)_2$. The nitrate-based compound may enable the conductive layer formed of a Mo single layer to have a good etching rate and an excellent profile.

The content of the nitrate-based compound may be in a range of 0.05 wt % to 5 wt % in the etchant composition. If the content of the nitrate-based compound is less than 0.05 wt %, a reverse taper and shoulder phenomenon may occur in the Mo single layer. However, if the content of the nitrate-based compound is more than 5 wt %, the etching rate of the Mo single layer may be reduced to decrease productivity.

The sulfate-based compound may be at least one selected from the group consisting of $H_2SO_4$, $Na_2SO_4$, $Na_2S_2O_8$, $K_2SO_4$, $K_2S_2O_8$, $CaSO_4$, $(NH_4)_2SO_4$ and $(NH_4)_2S_2O_8$. The sulfate-based compound plays a role in enhancing the etching rate and the profile of a Mo single layer. The content of the sulfate-based compound may be in a range of 0.05 wt % to 5 wt % in the etchant composition. If the content of the sulfate-based compound is less than 0.05 wt %, a critical dimension bias may become large when etching a conductive layer formed of a single Mo layer. However, if the content of the sulfate-based compound is more than 5 wt %, the etching rate of the Mo single layer may be reduced to decrease productivity.

The oxidation regulator may be at least one selected from the group consisting of $KMnO_4$, $K_2CrO_7$, $NaClO$, $NaClO_2$, $NaClO_3$, $NaClO_4$, $HClO_4$ and $HIO_4$. The oxidation regulator enables a Mo/AlNd layer to have a uniform tilt angle and also enables a passive oxide layer to be partially formed on the surface of an aluminum metal layer. The passive oxide layer is beneficial in that it decreases the etching rate of the aluminum. It is beneficial to decrease the etching rate of the aluminum to enable the aluminum to have an excellent profile because the etching rate of the aluminum is higher than that of a Mo single layer.

The content of the oxidation regulator may be in a range of 1 wt % to 10 wt % in the etchant composition. If the content of the oxidation regulator is less than 1 wt %, an undercut phenomenon may occur in the Mo/AlNd bilayer. However, if the content of the oxidation regulator is more than 10 wt %, a reverse taper in the Mo single layer may occur.

Thus, conductive layers made of different materials may be etched using the same etchant composition, even though the conductive layers are formed of materials, such as aluminum (Al), aluminum-neodymium (AlNd), or molybdenum (Mo).

Figure 1A:
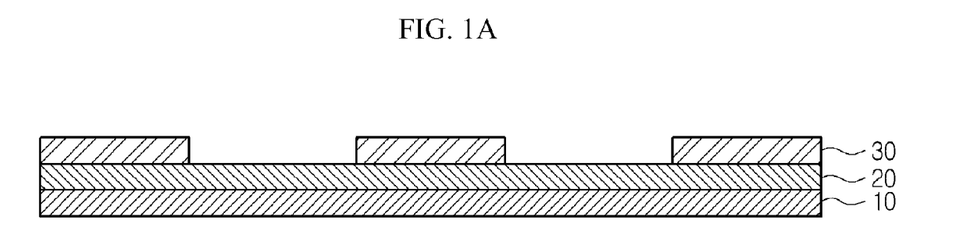
FIGS. 1A, 1B and 1C are cross-sectional views illustrating a method of patterning a conductive layer using an etchant composition according to an embodiment of the present invention.
Figure 1B:
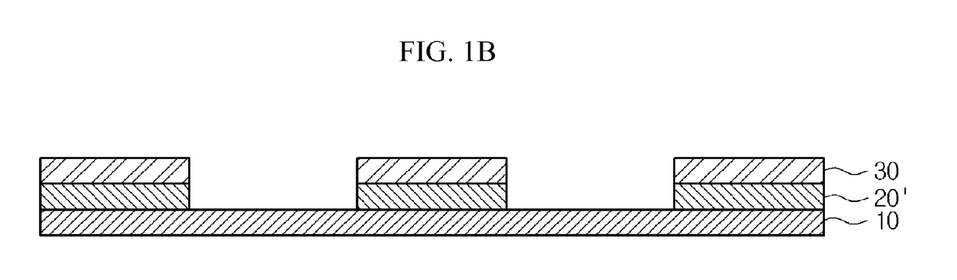
Figure 1C:
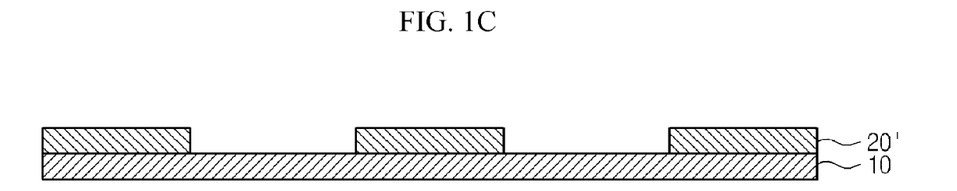

FIGS. 1A to 1C are cross-sectional views illustrating a method of patterning a conductive layer using the etchant composition according to an embodiment of the present invention.

Referring to FIG. 1A, a substrate 10 is provided. A conductive layer 20 is formed on the substrate 10. The conductive layer 20 may be a single layer formed of at least one of aluminum (Al), aluminum-neodymium (AlNd) alloy, molybdenum (Mo), and indium-tin-oxide (ITO), or a multilayer thereof.

A photoresist layer 30 may be formed on the conductive layer 20. Subsequently, an exposure mask (not shown) is aligned over the photoresist layer 30. The exposure mask has a predetermined shape corresponding to the pattern of a conductive pattern 20'. Then, ultraviolet light is irradiated on the exposure mask. Then, the photoresist layer 30 is patterned into the shape of the exposure mask. The photoresist layer 30 may be a negative photoresist layer through which a non-irradiated portion is removed, or a positive photoresist layer through which an irradiated portion is removed. The substrate is dipped into a developer solution thereby forming a photoresist pattern 30 exposing a portion of the conductive layer 20.

Referring to FIG. 1B, the exposed conductive layer 20 is etched using an etchant so as to form a conductive pattern 20'.

The etchant composition includes phosphoric acid having a concentration of about 40 to 70 wt %, nitric acid having a concentration of about 3 to 15 wt %, acetic acid having a concentration of about 5 to 35 wt %, a chlorine-based compound having a concentration of about 0.02 to 5 wt %, a nitrate-based compound having a concentration of about 0.05 to 5 wt %, a sulfate-based compound having a concentration of about 0.05 to 5 wt %, an oxidation regulator having a concentration of about 1 to 10 wt %, and a residual quantity of water.

The chlorine-based compound may be a compound that dissociates into a chlorine ion (Cl—). For instance, the chlorine-based compound may be at least one selected from the group consisting of $KCl$, $HCl$, $LiCl$, $NaCl$, $NH_4Cl$, $CuCl_2$, $FeCl_3$, $FeCl_2$, $CaCl_2$, $CoCl_2$, $NiCl_2$, $ZnCl_2$, $AlCl_3$, $BaCl_2$, $BeCl_2$, $BiCl_3$, $CdCl_2$, $CeCl_2$, $CsCl_2$, $CrCl_3$ and $H_2PtCl_3$.

The nitrate-based compound may be at least one selected from the group consisting of $NH_4NO_3$, $KNO_3$, $LiNO_3$, $Ca(NO_3)_2$, $NaNO_3$, $Zn(NO_3)_2$, $Co(NO_3)_2$, $Ni(NO_3)_2$, $Fe(NO_3)_3$, $Cu(NO_3)_2$ and $Ba(NO_3)_2$.

The sulfate-based compound may be at least one selected from the group consisting of $H_2SO_4$, $Na_2SO_4$, $Na_2S_2O_8$, $K_2SO_4$, $K_2S_2O_8$, $CaSO_4$, $(NH_4)_2SO_4$ and $(NH_4)_2S_2O_8$.

The oxidation regulator may be at least one selected from the group consisting of $KMnO_4$, $K_2CrO_7$, $NaClO$, $NaClO_2$, $NaClO_3$, $NaClO_4$, $HClO_4$ and $HIO_4$.

Thereafter, as illustrated in FIG. 1C, the photoresist pattern 30 is removed so that the conductive pattern 20' remains on the substrate 10.

The embodiments of the present invention will be more fully illustrated through experimental examples and comparative examples. The experimental examples below are exemplified for illustrative purpose so that the present invention is not limited to these examples.

Experimental Example 1

ITO is deposited on a substrate. Thereafter, after forming a photoresist layer on the ITO layer, exposure and development processes are performed so as to form a photoresist pattern exposing a portion of the ITO layer. Afterwards, after etching the exposed ITO layer using the etchant having a predetermined composition illustrated in Table 1 below, the photoresist pattern is removed to thereby form the ITO layer pattern. Sections before removing the photoresist patterns and sections after removing the photoresist pattern are observed by a scanning electron microscope (SEM) after etching the ITO layer into a predetermined configuration.

Experimental Example 2

The same processes as <Experimental Example 1> are performed except that Mo is deposited on the substrate to form a Mo single layer. Thus, the processes form a Mo single layer pattern.

Experimental Example 3

The same processes as <Experimental Example 1> are performed except that AlNd alloy and Mo are deposited on the substrate in sequence to form a Mo/AlNd bilayer. Thus, the processes form a Mo/AlNd bilayer pattern.

Comparative Examples 1 to 5

The same processes as <Experimental Example 3> are performed to form the Mo/AlNd bilayer pattern except that the Mo/AlNd bilayer is etched using an etchant having a different composition than that of the composition in <Experimental Example 3> as illustrated in Table 1 below.

Comparative Examples 6 and 7

The same processes as <Experimental Example 2> are performed to form the Mo single layer except that the Mo single layer is etched using an etchant having a different composition than that of the composition in <Experimental Example 2> as illustrated in Table 1 below.

Table 1 illustrates a variety of etchant compositions which are used in the experimental examples and comparative examples.

TABLE 1

(UNIT: WT %)

| | Ex. 1-3 | CE 1 | CE 2 | CE 3 | CE 4 | CE 5 | CE 6 | CE 7 |
|---|---|---|---|---|---|---|---|---|
| P | 60 | 38 | 60 | 60 | 60 | 60 | 60 | 60 |
| N | 6 | 6 | 2 | 6 | 6 | 6 | 6 | 6 |
| A | 12 | 12 | 12 | 4 | 12 | 12 | 12 | 12 |
| R | 4 | 4 | 4 | 4 | 0.5 | 4 | 4 | 4 |
| C | 0.1 | 0.1 | 0.1 | 0.1 | 0.1 | 5.5 | 0.1 | 0.1 |
| NS | 0.05 | 0.05 | 0.05 | 0.05 | 0.05 | 0.05 | 0.02 | 0.05 |
| SS | 2 | 2 | 2 | 2 | 2 | 2 | 2 | 0.02 |
| W | 18.85 | 37.85 | 19.85 | 23.85 | 19.35 | 10.45 | 15.88 | 17.83 |

Herein, P, N, A, R, C, NS, SS and W denote phosphoric acid, nitric acid, acetic acid, oxidation regulator, chlorine-based compound, nitrate-based compound, sulfate-based compound, and water, respectively. In addition, Ex. and CE denote experimental examples and comparative examples, respectively.

Figure 2A:
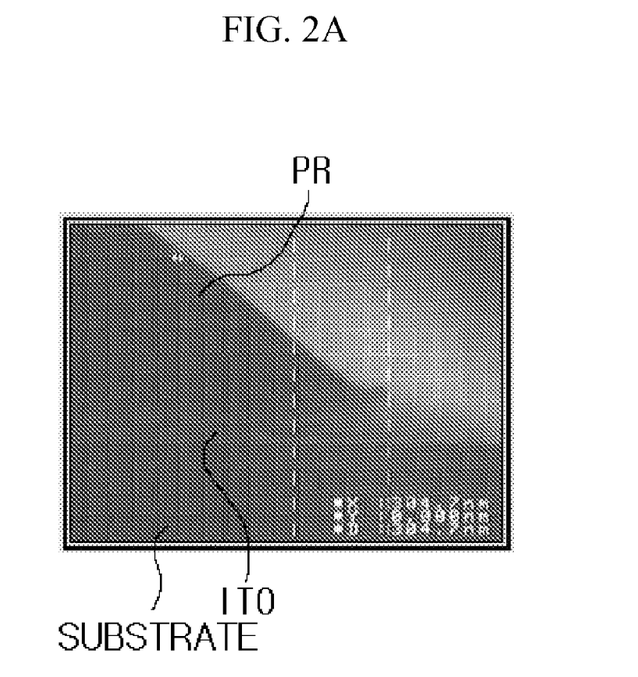
FIGS. 2A and 2B are scanning electron microscope (SEM) photographs illustrating sections of ITO layer patterns according to experimental example 1.
Figure 2B:
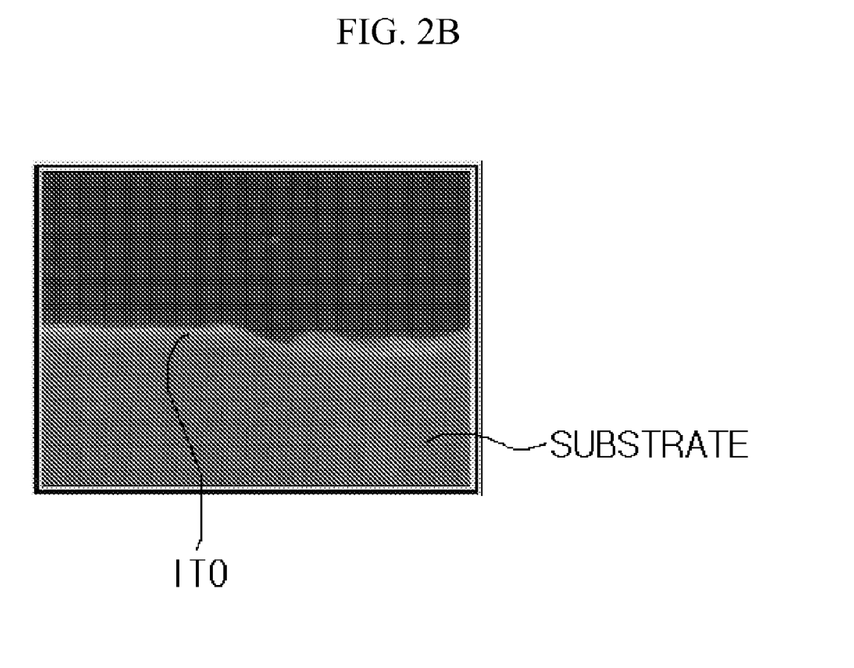

FIGS. 2A and 2B are SEM photographs illustrating the sections of the ITO layer patterns according to experimental example 1. That is, FIGS. 2A and 2B are the sections of the ITO layer patterns which are etched using the etchant having the composition of Table 1, wherein FIG. 2A is the SEM photograph before removing the photoresist pattern and FIG. 2B is the SEM photograph after removing the photoresist pattern.

As shown in FIGS. 2A and 2B, the ITO layer is etched using the etchant having the composition as illustrated in Table 1. As shown, it is confirmed that it is possible to form the ITO layer to have an excellent profile having a taper angle of 30°-60°.

Figure 3A:
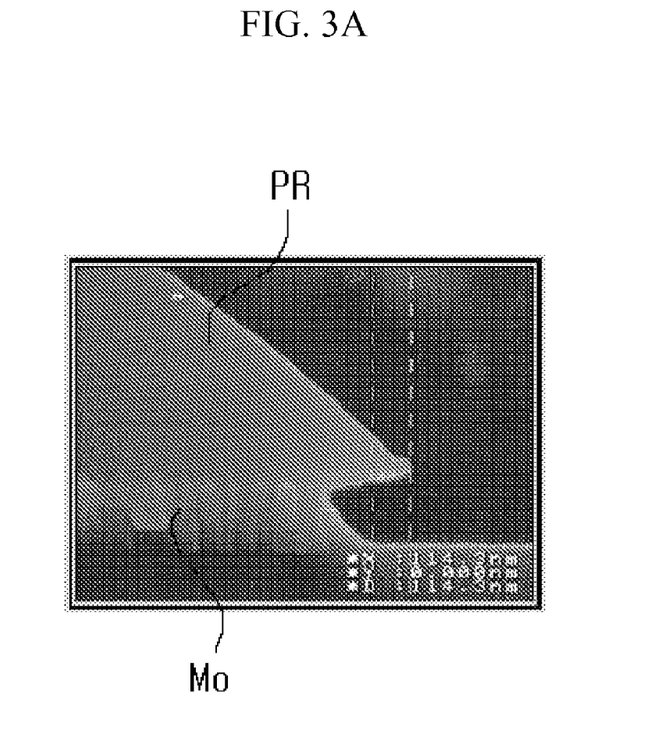
FIGS. 3A and 3B are SEM photographs illustrating sections of Mo layer patterns according to experimental example 2.
Figure 3B:
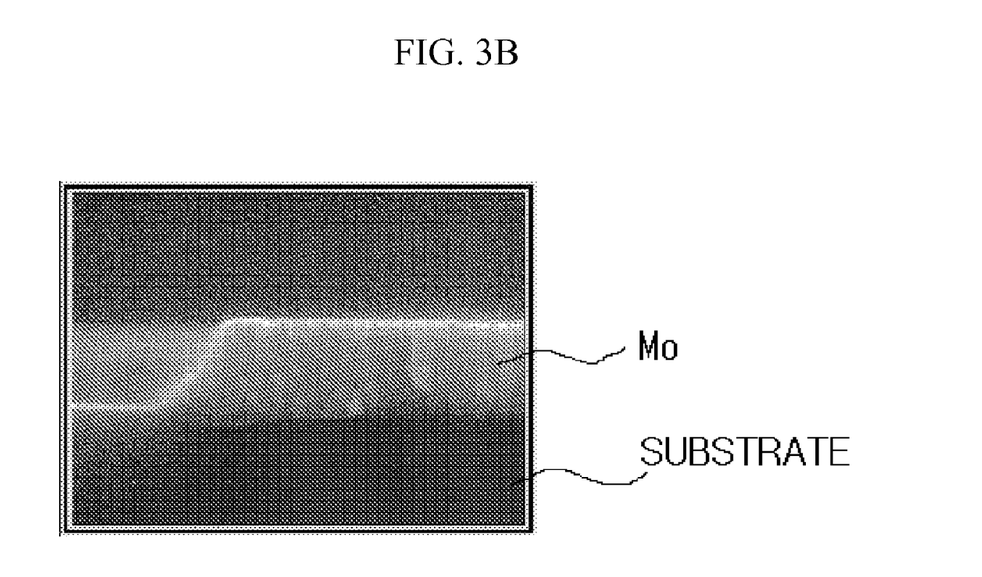

FIGS. 3A and 3B are SEM photographs illustrating the sections of the Mo layer patterns according to the experimental example 2. That is, FIGS. 3A and 3B are the sections of the Mo single layer patterns which are etched using the etchant having the composition of Table 1, wherein FIG. 3A is the SEM photograph before removing the photoresist pattern and FIG. 3B is the SEM photograph after removing the photoresist pattern.

As shown in FIGS. 3A and 3B, the Mo single layer is etched using the etchant having the composition as illustrated in Table 1. As shown, it is confirmed that it is possible to form the Mo single layer to have an excellent profile having a taper angle of 45°-70°.

Figure 4A:
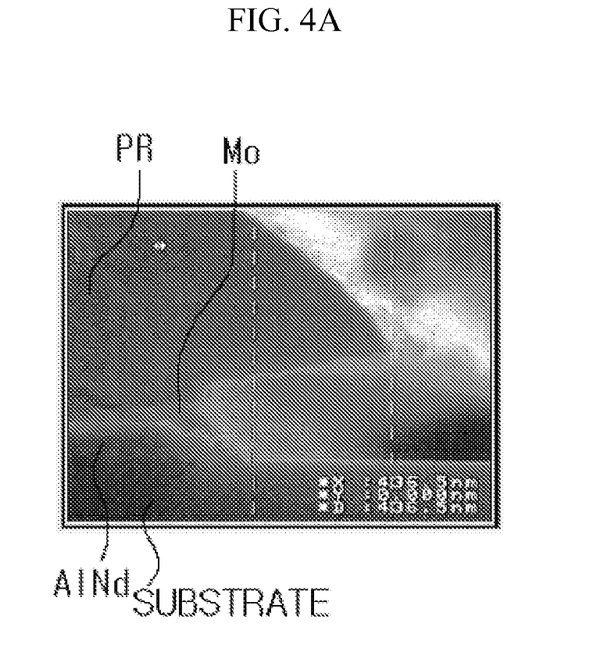
FIGS. 4A and 4B are SEM photographs illustrating sections of Mo/AlNd bilayer patterns according to experimental example 3.
Figure 4B:
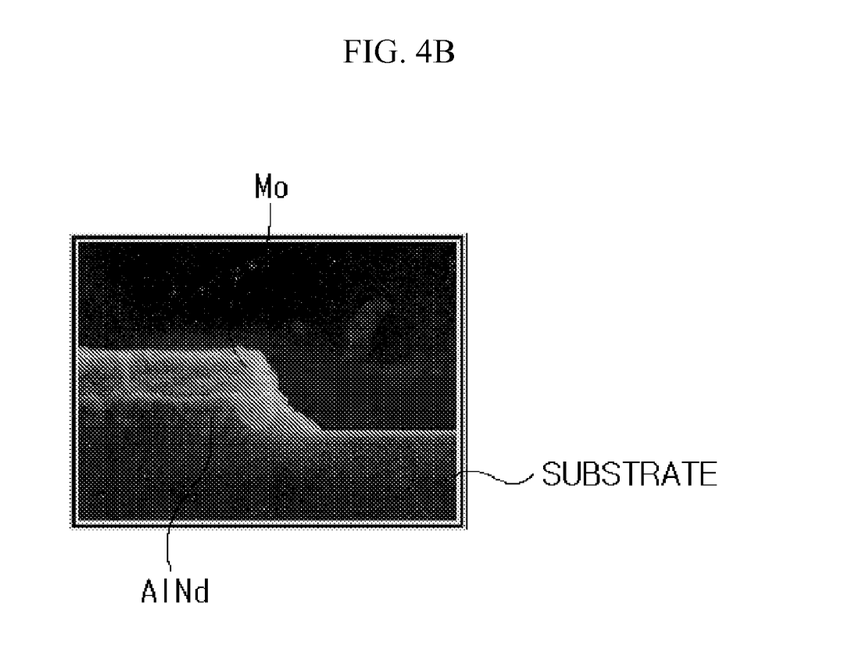

FIGS. 4A and 4B are SEM photographs illustrating the sections of the Mo/AlNd bilayer patterns according to the experimental example 3.

FIGS. 4A and 4B are SEM photographs illustrating the sections of the Mo/AlNd bilayer pattern that are etched using the etchant having the composition of Table 1, wherein FIG. 4A is the SEM photograph before removing the photoresist pattern and FIG. 4B is the SEM photograph after removing the photoresist pattern.

As shown in FIGS. 4A and 4B, the Mo/AlNd bilayer is etched using the etchant having the composition as illustrated in Table 1. As shown, it is confirmed that it is possible to form the Mo/AlNd bilayer to have an excellent profile having a taper angle of 45°-70° without an undercut phenomenon in AlNd.

Thus, conductive layers formed of different materials may be etched to have excellent etching profiles using the same etchant composition that may include 60 wt % phosphoric acid, 6 wt % nitric acid, 12 wt % acetic acid, 4 wt % oxidation regulator, 0.1 wt % chlorine-based compound, 0.05 wt % nitrate-based compound, and 2 wt % sulfate-based compound.

Figure 5A:
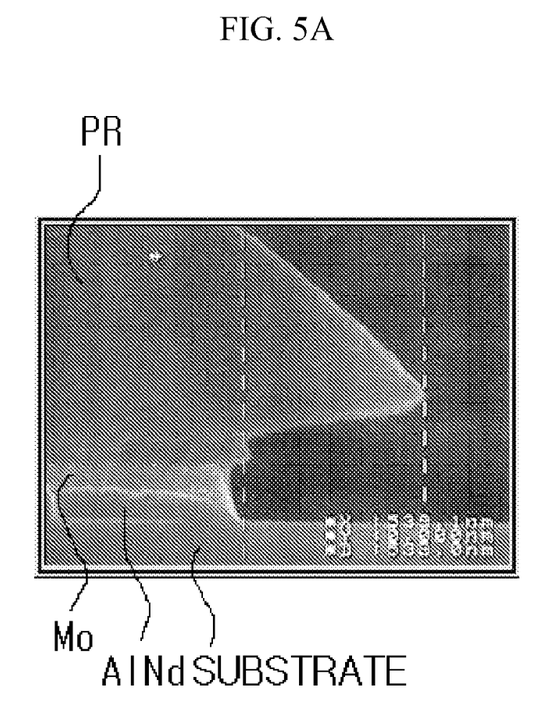
FIGS. 5A and 5B are SEM photographs illustrating sections of Mo/AlNd bilayer patterns according to comparative example 1.
Figure 5B:
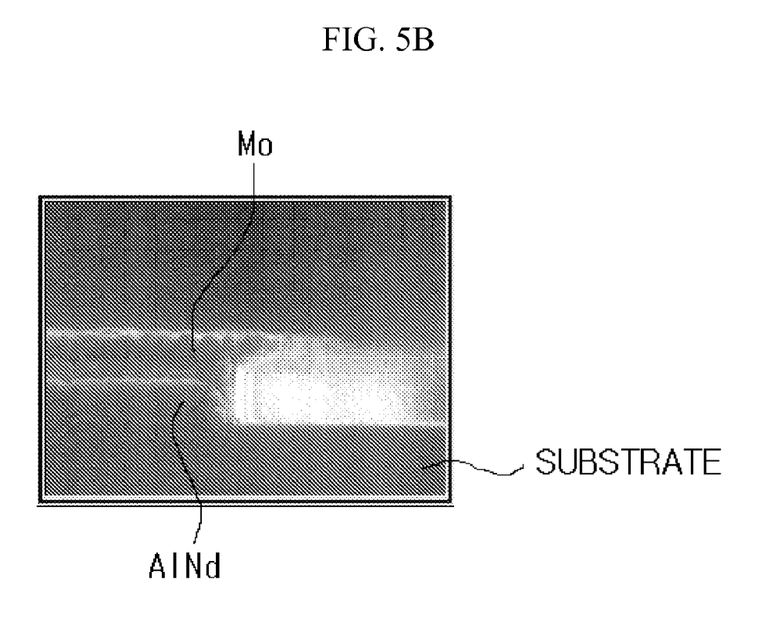

FIGS. 5A and 5B are SEM photographs illustrating sections of Mo/AlNd bilayer patterns according to comparative example 1.

FIGS. 5A and 5B are SEM photographs illustrating sections of the Mo/AlNd bilayer patterns etched using the etchant having the composition of Table 1, wherein FIG. 5A is the SEM photograph before removing the photoresist pattern FIG. 5B is the SEM photograph after removing the photoresist pattern.

As shown in FIGS. 5A and 5B, if using the etchant in which the content of phosphoric acid is less than 40 wt %, an undercut phenomenon occurs in the AlNd layer. In addition, the profile of the Mo single layer is poor.

Figure 6A:
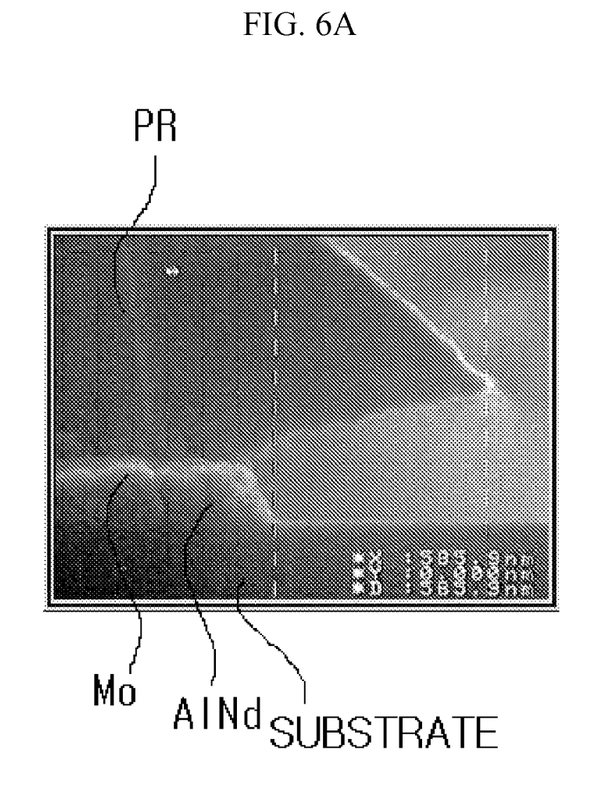
FIGS. 6A and 6B are SEM photographs illustrating sections of Mo/AlNd bilayer patterns according to the comparative example 2.
Figure 6B:
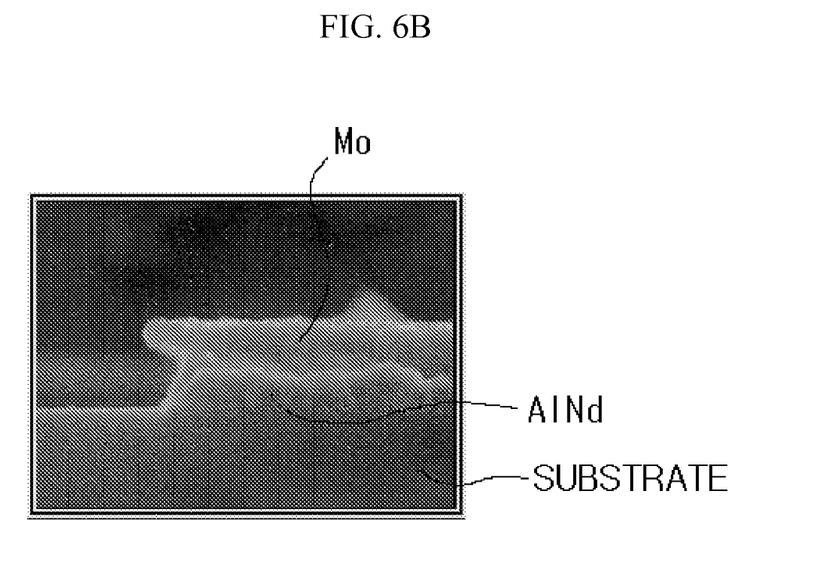

FIGS. 6A and 6B are SEM photographs illustrating sections of Mo/AlNd bilayer patterns according to comparative example 2.

FIGS. 6A and 6B are SEM photographs illustrating sections of the Mo/AlNd bilayer patterns etched using the etchant having the composition of Table 1, wherein FIG. 6A is the SEM photograph before removing the photoresist pattern and FIG. 6B is the SEM photograph after removing the photoresist pattern.

As shown in FIGS. 6A and 6B, if using the etchant in which the content of the nitric acid is less than 30 wt %, an undercut phenomenon occurs in the AlNd layer. In addition, the profile of the Mo single layer pattern is poor.

Figure 7A:
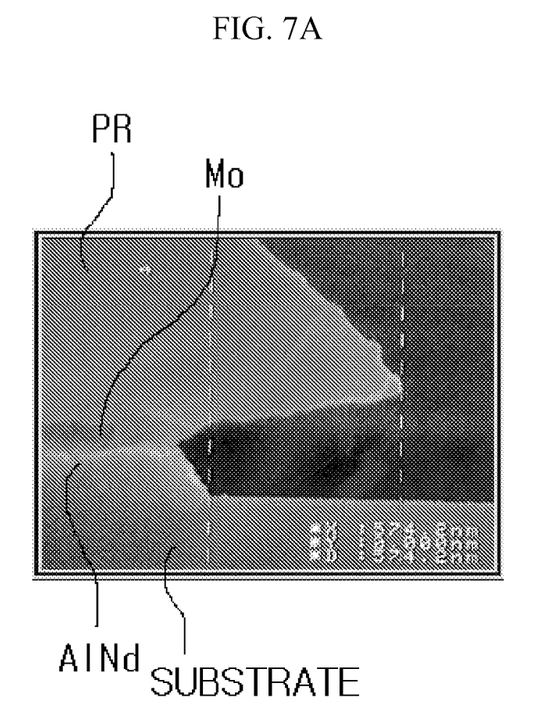
FIGS. 7A and 7B are SEM photographs illustrating sections of Mo/AlNd bilayer patterns according to the comparative example 3.
Figure 7B:
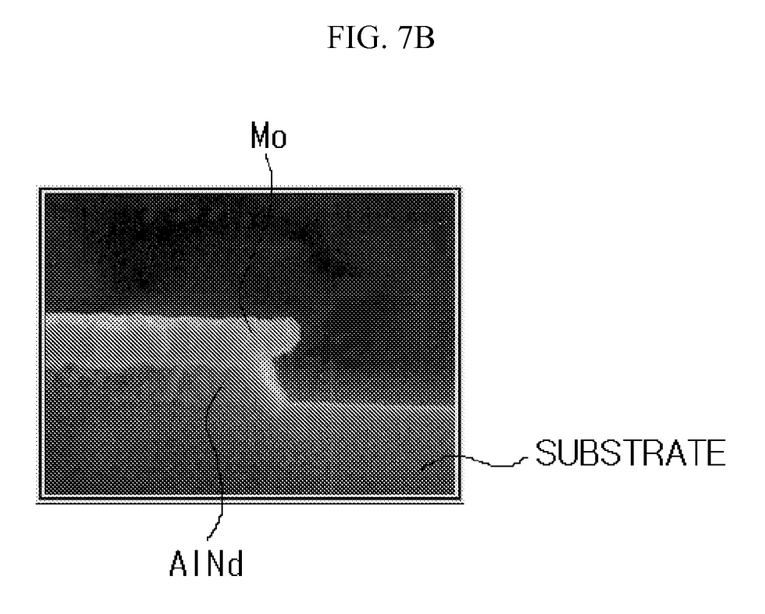

FIGS. 7A and 7B are SEM photographs illustrating sections of Mo/AlNd bilayer patterns according to comparative example 3.

FIGS. 7A and 7B are SEM photographs illustrating sections of Mo/AlNd bilayer patterns etched using the etchant having the composition of Table 1, wherein FIG. 7A is the SEM photograph before removing the photoresist pattern and FIG. 7B is the SEM photograph after removing the photoresist pattern.

As shown in FIGS. 7A and 7B, if using the etchant in which the content of the acetic acid is less than 5 wt %, the undercut phenomenon occurs in the AlNd layer.

Figure 8A:
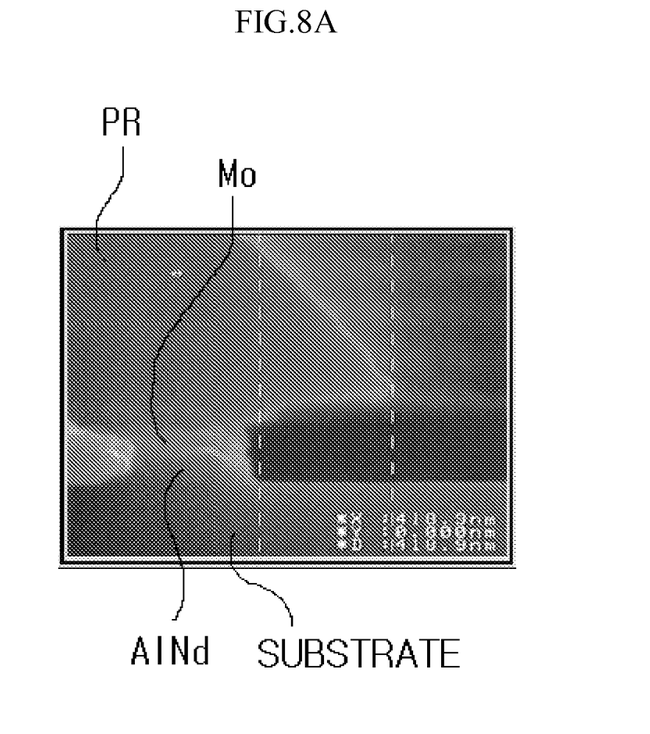
FIGS. 8A and 8B are SEM photographs illustrating sections of Mo/AlNd bilayer patterns according to the comparative example 4.
Figure 8B:
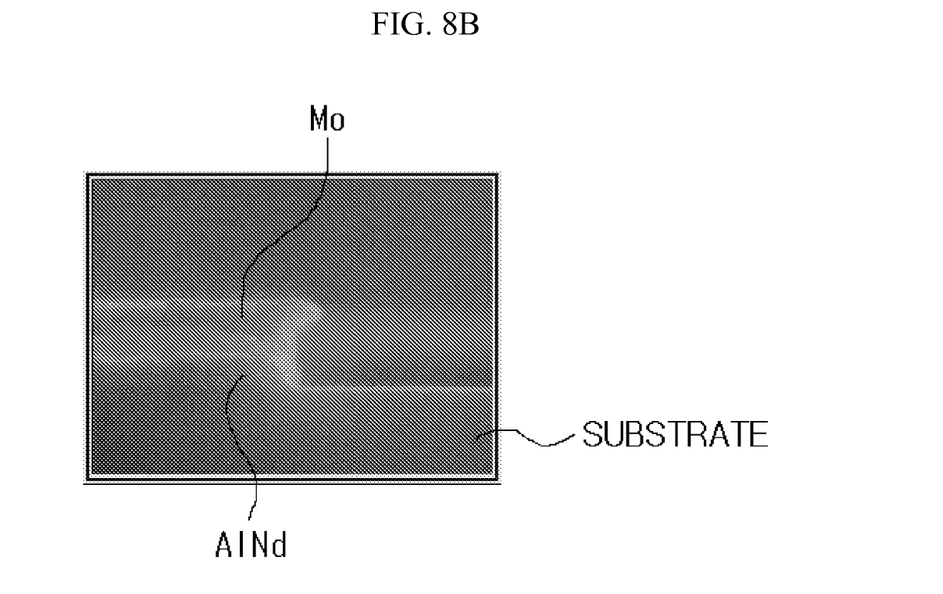

FIGS. 8A and 8B are SEM photographs illustrating sections of Mo/AlNd bilayer patterns according to comparative example 4.

Herein, FIGS. 8A and 8B are SEM photographs illustrating sections of Mo/AlNd bilayer patterns etched using the etchant having the composition of Table 1, wherein FIG. 8A is the SEM photograph before removing the photoresist pattern and FIG. 8B is the SEM photographs after removing the photoresist pattern.

As shown in FIGS. 8A and 8B, if using the etchant in which the content of the oxidation regulator is less than 1 wt %, an undercut phenomenon occurs in the AlNd bilayer pattern.

Figure 9A:
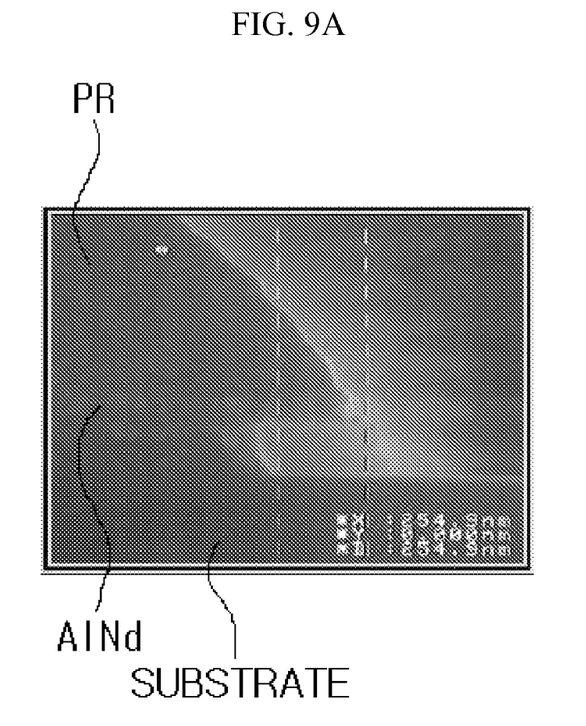
FIGS. 9A and 9B are SEM photographs illustrating sections of Mo/AlNd bilayer patterns according to the comparative example 5.
Figure 9B:
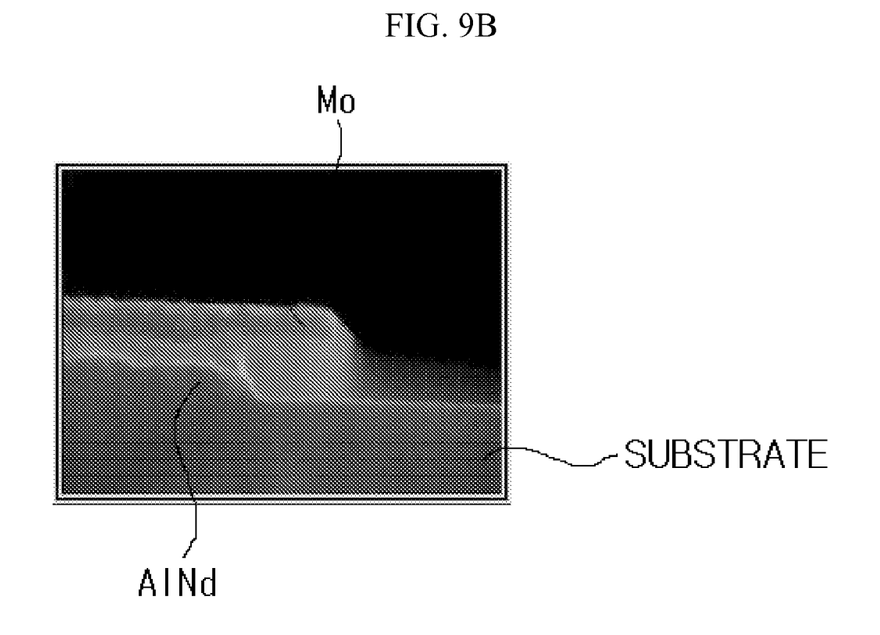

FIGS. 9A and 9B are SEM photographs illustrating sections of Mo/AlNd bilayer patterns according to comparative example 5.

FIGS. 9A and 9B are SEM photographs illustrating sections of the Mo/AlNd bilayer patterns etched using the etchant having the composition of Table 1, wherein FIG. 9A is the SEM photograph before removing the photoresist pattern and FIG. 9B is the SEM photograph after removing the photoresist pattern.

As shown in FIG. 9A, if using the etchant in which the content of the chlorine-based compound is more than 1 wt %, the photoresist pattern is decomposed so that the AlNd layer is not fully protected. In addition, an undercut phenomenon occurs as illustrated in FIGS. 9A and 9B.

Figure 10A:
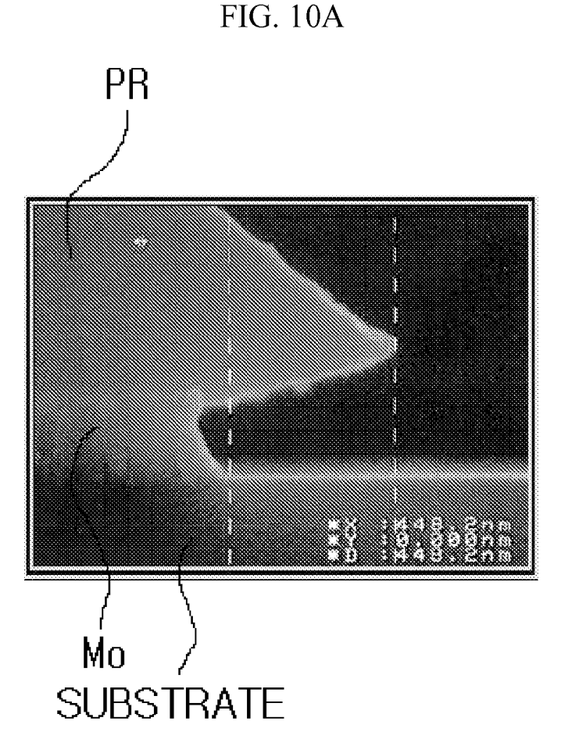
FIGS. 10A and 10B are SEM photographs illustrating sections of Mo single layer patterns according to the comparative example 6.
Figure 10B:
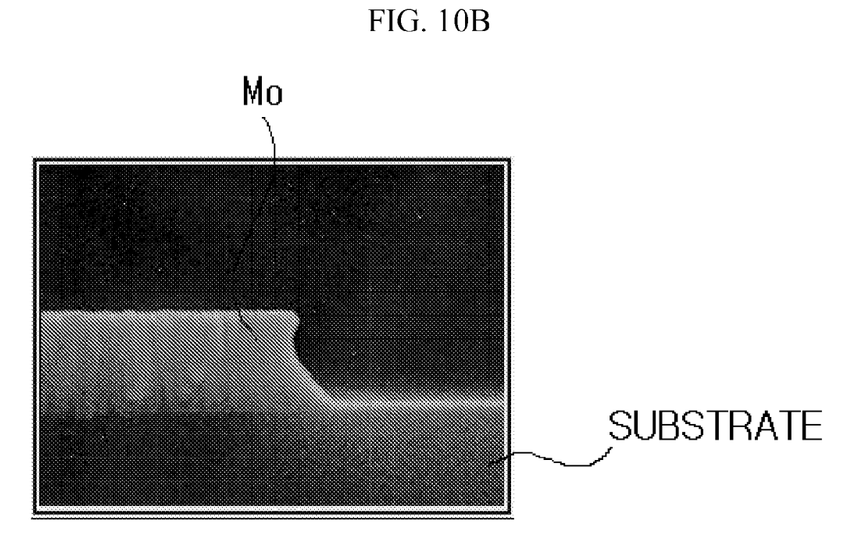

FIGS. 10A and 10B are SEM photographs illustrating sections of the Mo single layer patterns according to comparative example 6.

FIGS. 10A and 10B are SEM photographs illustrating sections of the Mo single layer patterns etched using the etchant having the composition of Table 1, wherein FIG. 10A is the SEM photograph before removing the photoresist pattern and FIG. 10B is the SEM photograph after removing the photoresist pattern.

As shown in FIGS. 10A and 10B, if using the etchant in which the content of the nitrate-based compound is less than 0.05 wt %, a reverse taper and shoulder phenomenon may occur in the Mo single layer pattern.

Figure 11A:
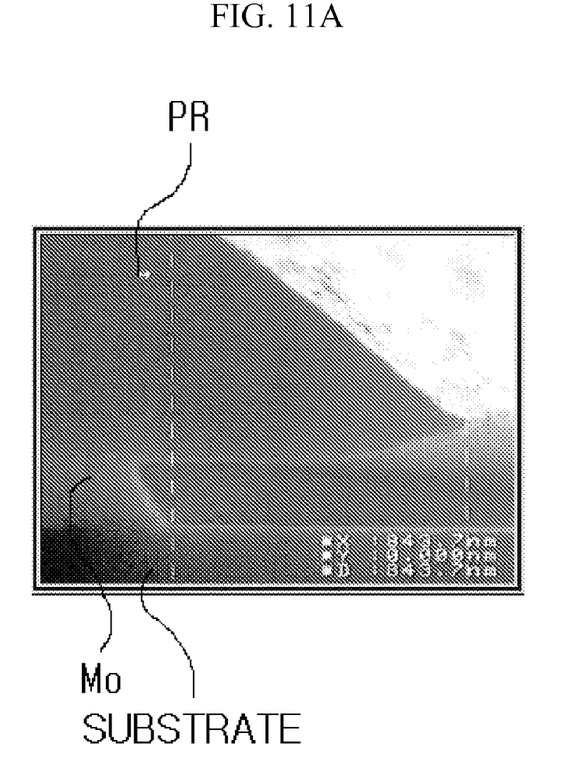
FIGS. 11A and 11B are SEM photographs illustrating sections of Mo single layer patterns according to the comparative example 7.
Figure 11B:
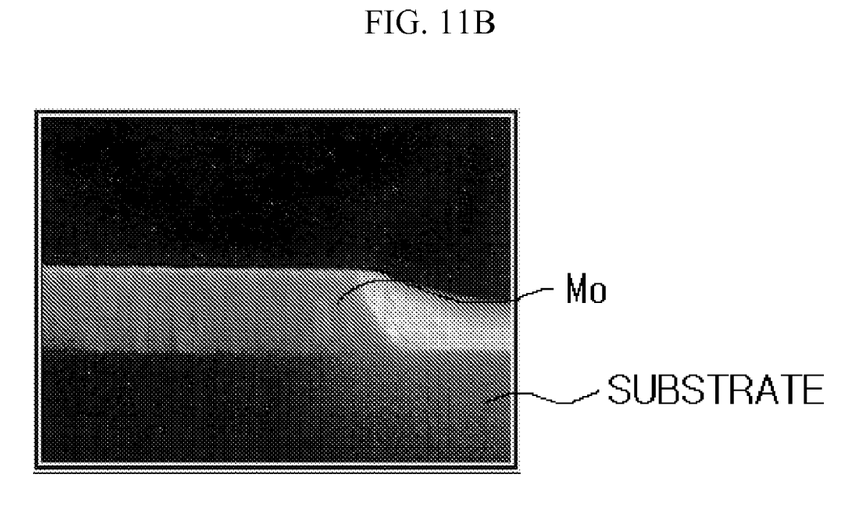

FIGS. 11A and 11B are SEM photographs illustrating sections of the Mo single layer patterns according to comparative example 7.

FIGS. 11A and 11B are SEM photographs illustrating sections of the Mo single layer patterns etched using the etchant having the composition of Table 1, wherein FIG. 11A is the SEM photograph before removing the photoresist pattern and FIG. 11B is the SEM photograph after removing the photoresist pattern.

As shown in FIGS. 11A and 11B, if using the etchant in which the content of the sulfate-based compound is less than 0.05 wt %, the critical dimension bias of the Mo single layer pattern is too large.

In order to etch conductive layers formed of different materials, i.e., the Mo single layer, the ITO layer and the Mo/AlNd bilayer, such that they have excellent etching profiles using the same etchant composition, an etchant composition including 40-70 wt % phosphoric acid, 3-15 wt % nitric acid, 5-35 wt % acetic acid, 0.02-5 wt % chlorine-based compound, 0.05-5 wt % nitrate-based compound, 0.05-5 wt % sulfate-based compound, and 1-10 wt % oxidation regulator may be used.

Figure 12A:
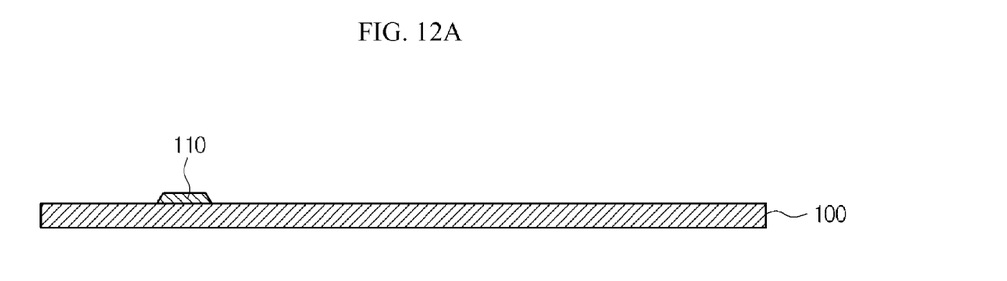
FIGS. 12A, 12B and 12C are cross-sectional views illustrating a method of manufacturing a flat panel display device according to an embodiment of the present invention.
Figure 12B:
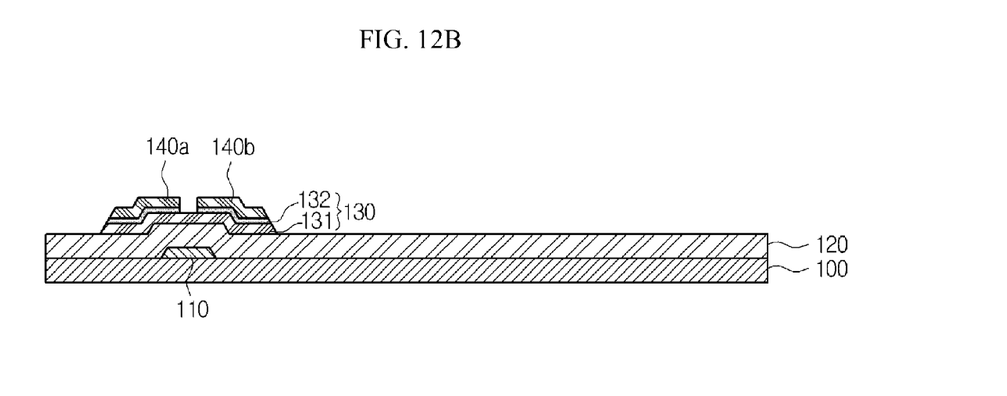
Figure 12C:
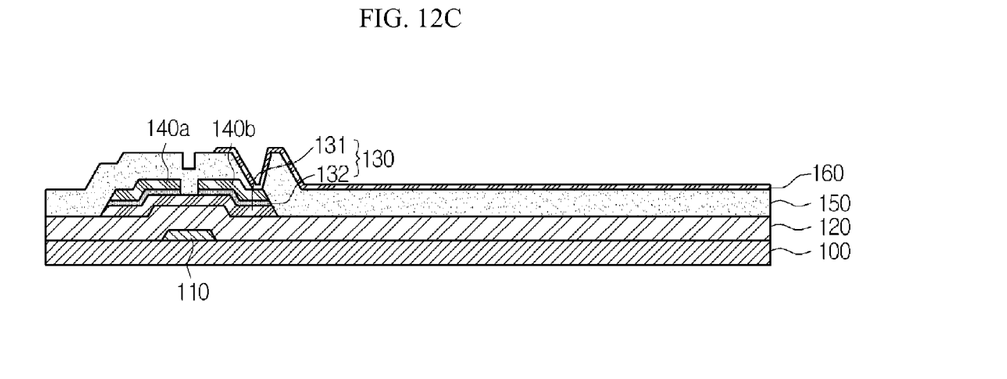

FIGS. 12A, 12B and 12C are cross-sectional views illustrating a method of manufacturing a flat panel display device according to an embodiment of the present invention.

Referring to FIG. 12A, substrate 100 is prepared. The substrate 100 may be formed of plastic, glass or metal. A first conductive layer is formed on the substrate 100. The first conductive layer is patterned into a predetermined configuration to thereby form a gate interconnection (not shown) and a gate electrode 110. The first conductive layer may be a single layer formed of at least one of aluminum (Al), aluminum-neodymium (AlNd) alloy, molybdenum (Mo), and indium-tin-oxide (ITO), or a multilayer thereof. The gate interconnection and the gate electrode 110 may be formed as a bilayer in which the Mo layer and the AlNd alloy layer are stacked in sequence.

Referring to FIG. 12B, a gate insulating layer 120 is formed on the gate interconnection and the gate electrode 110, wherein the gate insulating layer 120 is formed of a silicon layer, a silicon nitride layer, or multilayer thereof. The gate insulating layer 120 may be formed using chemical vapor deposition (CVD) or a sputtering process. For instance, the CVD process may be performed using at least one of low pressure CVD (LPCVD), atmospheric pressure CVD (APCVD), and plasma enhanced CVD (PECVD).

Thereafter, an active layer 131 and an ohmic layer 132 are stacked on the gate insulating layer 120 corresponding to the gate electrode 110 so as to form a semiconductor layer 130 configured with the active layer 131 and the ohmic layer 132. Herein, the active layer 131 may be formed of amorphous silicon, and the ohmic contact layer 132 may be formed of amorphous silicon doped with n-type or p-type impurities.

After a second conductive layer is formed on the semiconductor layer 130, it is patterned into a predetermined shape to thereby form a data interconnection (not shown) and source/drain electrodes 140a and 140b. Herein, the second conductive layer may be a single layer formed of at least one of aluminum (Al), aluminum-neodymium (AlNd) alloy, molybdenum (Mo), and indium-tin-oxide (ITO), or a multilayer thereof. The data interconnection (not shown) and the source/drain electrodes 140a and 140b may be formed of a Mo singe layer.

Accordingly, a thin film transistor, configured with the gate electrode 110, the source/drain electrodes 140a and 140b, and the semiconductor layer 130, is completed.

Referring to FIG. 12C, a passivation layer 150 is formed on the data interconnection and the source/drain electrodes 140a and 140b. Thereafter, a contact hole is formed so as to expose a portion of the drain electrode 140b. Herein, the passivation layer 150 may be formed of silicon nitride, silicon oxide, acryl-based compound, benzocyclobutene (BCB), or perfluorocyclobutane (PFCB).

Afterwards, a third conductive layer is formed on the passivation layer 150 such that it is electrically connected to the drain electrode 140b through the contact hole. Subsequently, the third conductive layer is patterned into a predetermined shape thereby forming a pixel electrode 160. The pixel electrode 160 may be formed of a transparent electrode, e.g., ITO or IZO.

At this time, each of the gate electrode 110, the source/drain electrodes 140a and 140b, and the pixel electrode 160 may be patterned using the same etchant composition. The etchant composition may include 40-70 wt % phosphoric acid, 3-15 wt % nitric acid, 5-35 wt % acetic acid, 0.02-5 wt % chlorine-based compound, 0.05-5 wt % nitrate-based compound, 0.05-5 wt % sulfate-based compound, 1-10 wt % oxidation regulator, and a residual quantity of water.

Although a method of manufacturing a bottom gate type TFT is illustrated, the present invention, including the etchant composition, may be used to manufacture another type TFT such as a top gate type TFT or the like.

Thereafter, a flat panel display device may be fabricated according to well-known processes. For instance, if the flat panel display device is a liquid crystal display device (LCD), a liquid crystal is injected between a first substrate in which a color filter and a transparent electrode are disposed and a second substrate in which the TFT is formed, to thereby manufacture the LCD.

In addition, if the flat panel display device is an organic electroluminescence display device (OELD), an opposite electrode is formed on an organic layer after forming the organic layer to include a luminescent layer on the pixel electrode, to thereby manufacture the OELD. Herein, the organic layer may further include a charge transport layer or a charge injection layer.

Therefore, even if the gate interconnection and gate electrode, the data interconnection and source/drain electrodes, and the pixel electrode are formed of different materials, they may be patterned using the same etchant composition. Therefore, processes may be simplified so that it is easy to manufacture the flat panel display device.

According to the present invention, because the etchant composition is capable of simultaneously etching aluminum, molybdenum, and ITO, all of the gate electrode, the source/drain electrodes, and the pixel electrode may be formed using the same etchant so that it is easy to control processing.

In addition, etching processes may be simplified so that it is possible to enhance productivity and reduce manufacturing costs.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An etchant composition comprising a phosphoric acid, a nitric acid, an acetic acid, water and an additive, wherein the additive comprises a chlorine-based compound, a nitrate-based compound, a sulfate-based compound, and an oxidation regulator, wherein the phosphoric acid has a concentration of about 40 to 70 wt %, the nitric acid has a concentration of about 3 to 15 wt %, the acetic acid has a concentration of about 5 to 35 wt %, the chlorine-based compound has a concentration of about 0.02 to 5 wt %, the nitrate-based compound has a concentration of about 0.05 to 5 wt %, the sulfate-based compound has a concentration of about 0.05 to 5 wt %, the oxidation regulator has a concentration of about 1 to 10 wt %, and a quantity of water is a residual amount.

2. The etchant composition according to claim 1, wherein the chlorine-based compound is at least one selected from the group consisting of KCl, HCl, LiCl, NaCl, $NH_4Cl$, $CuCl_2$, $FeCl_3$, $FeCl_2$, $CaCl_2$, $CoCl_2$, $NiCl_2$, $ZnCl_2$, $AlCl_3$, $BaCl_2$, $BeCl_2$, $BiCl_3$, $CdCl_2$, $CeCl_2$, $CsCl_2$, $CrCl_3$ and $H_2PtCl_3$.

3. The etchant composition according to claim 1, wherein the nitrate-based compound is at least one selected from the group consisting of $NH_4NO_3$, $KNO_3$, $LiNO_3$, $Ca(NO_3)_2$, $NaNO_3$, $Zn(NO_3)_2$, $Co(NO_3)_2$, $Ni(NO_3)_2$, $Fe(NO_3)_3$, $Cu(NO_3)_2$ and $Ba(NO_3)_2$.

4. The etchant composition according to claim 1, wherein the sulfate-based compound is at least one selected from the group consisting of $H_2SO_4$, $Na_2SO_4$, $Na_2S_2O_8$, $K_2SO_4$, $K_2S_2O_8$, $CaSO_4$, $(NH_4)_2SO_4$ and $(NH_4)_2S_2O_8$.

5. The etchant composition according to claim 1, wherein the oxidation regulator is at least one selected from the group consisting of $KMnO_4$, $K_2CrO_7$, NaClO, $NaClO_2$, $NaClO_3$, $NaClO_4$, $HClO_4$ and $HIO_4$.

\* \* \* \* \*